(12) United States Patent
Florean et al.

(10) Patent No.: US 10,297,969 B2
(45) Date of Patent: May 21, 2019

(54) DIODE PUMPED HIGH PEAK POWER LASER SYSTEM FOR MULTI-PHOTON APPLICATIONS

(71) Applicant: Newport Corporation, Irvine, CA (US)

(72) Inventors: Andrei C. Florean, Menlo Park, CA (US); James D. Kafka, Palo Alto, CA (US)

(73) Assignee: Newport Corporation, Irvine, CA (US)

(*) Notice: Subject to any disclaimer, the term of this patent is extended or adjusted under 35 U.S.C. 154(b) by 0 days.

(21) Appl. No.: 15/736,280

(22) PCT Filed: Jun. 20, 2016

(86) PCT No.: PCT/US2016/038356
§ 371 (c)(1),
(2) Date: Dec. 13, 2017

(87) PCT Pub. No.: WO2016/209766
PCT Pub. Date: Dec. 29, 2016

(65) Prior Publication Data
US 2019/0006813 A1    Jan. 3, 2019

Related U.S. Application Data

(60) Provisional application No. 62/183,155, filed on Jun. 22, 2015.

(51) Int. Cl.
*H01S 3/30* (2006.01)
*G02F 1/39* (2006.01)
(Continued)

(52) U.S. Cl.
CPC ........ *H01S 3/09415* (2013.01); *H01S 3/0811* (2013.01); *H01S 3/0813* (2013.01);
(Continued)

(58) Field of Classification Search
CPC .... H01S 3/0811; H01S 3/1633; H01S 3/1653; H01S 3/0805; H01S 3/1109
(Continued)

(56) References Cited

U.S. PATENT DOCUMENTS 5,296,960 A * 3/1994 Ellingson .................. G02F 1/37
359/328
5,412,683 A * 5/1995 Nighan, Jr. ............... H01S 3/08
372/101

(Continued)

OTHER PUBLICATIONS

Uemura et al., "Generation of 12-fs pulses from a diode-pumped Kerr-lens mode-locked Cr:LiSAF laser," Optics Letters, vol. 24, No. 11, Jun. 1, 1999.
(Continued)

*Primary Examiner* — Tuan N Nguyen
(74) *Attorney, Agent, or Firm* — Brian F. Swienton; Edward Scott Trask

(57) ABSTRACT

The present application discloses various embodiments of a high peak power laser system which includes a diode pump source configured to directly pump at least one optical crystal positioned within the laser cavity, the diode pump source emitting at least one pump beam comprised of two or more vertically stacked optical signals having a wavelength from about 400 nm to about 1100 nm., the optical crystal configured to output at least one optical output having a wavelength of about 750 nm to about 1100 nm and having an output power of about 25 kW or more.

13 Claims, 5 Drawing Sheets

(51) Int. Cl.
*H01S 3/0941* (2006.01)
*H01S 3/081* (2006.01)
*H01S 3/11* (2006.01)
*H01S 3/16* (2006.01)
*H01S 5/40* (2006.01)
*H01S 3/08* (2006.01)
*H01S 3/105* (2006.01)
*H01S 5/00* (2006.01)
*H01S 3/042* (2006.01)
*H01S 3/04* (2006.01)

(52) U.S. Cl.
CPC .......... *H01S 3/1112* (2013.01); *H01S 3/1623* (2013.01); *H01S 3/1625* (2013.01); *H01S 3/1633* (2013.01); *H01S 3/1636* (2013.01); *H01S 3/1653* (2013.01); *H01S 3/1656* (2013.01); *H01S 5/4012* (2013.01); *H01S 3/042* (2013.01); *H01S 3/0404* (2013.01); *H01S 3/0407* (2013.01); *H01S 3/0805* (2013.01); *H01S 3/105* (2013.01); *H01S 3/1109* (2013.01); *H01S 3/1645* (2013.01); *H01S 5/0071* (2013.01)

(58) Field of Classification Search
USPC .......................................... 372/41; 250/492.1
See application file for complete search history.

(56) References Cited

U.S. PATENT DOCUMENTS

2008/0037595 A1* 2/2008 Gankkhanov ............. G01J 3/10
                                                                372/3
2011/0180729 A1* 7/2011 Kafka .................. G01N 21/359
                                                                250/492.1

OTHER PUBLICATIONS

Uemura et al., "Development of Diode-Pumped Kerr-Lens Mode-Locked Cr:LiSAF Laser," IEEE Journal of Quantum Electroncis, vol. 39, No. 1, Jan. 2003.

Demirbas et al., "Low-Cost, single-mode diode-pumped Cr:Colquiriite lasers," OPtics Express, vol. 17, No. 16, Aug. 3, 2009.

Demirbas et al., "Comparative investigation of diode pumping for continuous-wave and mode-locked Cr3+:LiCAF," J. Opt. Soc. Am., vol. 26, No. 1, Jan. 2009.

Demirbas et al., "High efficient, low-cost femtosecond Cr3+:LiCAF laser pumped by single-mode diodes," Opt. Lett. Mar. 15, 2008; 33(6): 590-592.

Demirbas et al., "Generation of 15nJ pulses from a highly efficient, low-cost multipass-cavity Cr3+:LiCAF laser," Opt. Lett. Feb. 15, 2009, vol. 34, No. 4.

Demirbas et al., "A low-cost cavity-dumped femtosecond Cr:LiSAF laser producing >100 nJ pulses," Optics Letters, vol. 35, Issue 4, pp. 607-609 (2010).

Demirbas et al., "Widely-Tunable Femtosecond Operation of Cr:LiSAF Lasers using Broadband Saturable Bragg Reflectors," OSA Tech. Dig., 2010, paper CThl3.

Demirbas et al., "Mode-locked tuning of diode-pumped femtosecond Cr:LiSAF and Cr:LiCAF lasers using AlGaAs-based saturable Bragg reflectors," OSA Tech. Dig., 2011, paper AWA3.

Mellish et. al. All-solid-state diode-pumped Cr:LiSAF femtosecond oscillator and regenerative amplifier, Applied Phy. B 65, 221-226 (1997).

Robertson et.al., "Diode-pumped broadly tunable (809-910 nm) femtosecond Cr:LiSAF laser," Optics Communications 147 (1998) 294-298.

Sakadzic et al., "Multi-photon microscopy with a low-cost and highly efficient Cr:LiCAF laser," Optics Express, vol. 16, No. 25, Dec. 8, 2008.

* cited by examiner

DIODE PUMPED HIGH PEAK POWER LASER SYSTEM FOR MULTI-PHOTON APPLICATIONS

CROSS-REFERENCE TO RELATED APPLICATIONS

The present application claims priority to PCT Appl. Ser. No. PCT/US16/38356, entitled "Diode Pumped High Peak Power Laser System for Multi-Photon Applications," filed on Jun. 20, 2016, which claims priority from United States Provisional Pat. Appl. Ser. No. 62/183,155, entitled "Diode Pumped High Peak Power Laser System for Multi-Photon Applications," filed on Jun. 22, 2015, the entire contents both of which are incorporated by reference herein.

BACKGROUND

Femtosecond lasers are presently used in a wide variety of applications. One common application of these devices is biological research, such as bio-imaging, two-photon microscopy, medical diagnostics, vision correction, the study and applications of light-tissue interactions, and the like. The use and applicability of femtosecond lasers accelerated after the development of turn-key Ti:sapphire oscillators, which were a major advancement from the point of view of performance and ease of use.

Typically, biological research and related applications require that the laser system offers:

(A) High peak power: many applications based on non-linear light-matter interactions require high laser intensity. High peak power (>100 kW) requires high pulse energy and short pulse durations;

(B) High repetition rates: enable high acquisition rates with excellent averaging (low noise). For a laser pumped with limited pump power the demands of high peak power and high repetition rates are contradictory since the pulse energy is given by the (limited) output average power divided by the repetition rate;

(C) Pulse durations within a desired range: shorter pulses result in higher peak power. However very short pulses (<25 fs) require expensive dispersion management add-ons to balance the temporal dispersion produced by application-dependent accessories (microscope objectives, modulators etc.). Very short pulses also require very large spectral bandwidths, which in turn require expensive optical elements. Large spectral bandwidths can be harmful for applications where wavelength selectivity is desirable. As a consequence pulses in the 50 fs-100 fs range are preferred; and (D) Lasing wavelength within a desired range: most biological materials and bio-research materials interact efficiently with light only at specific wavelengths. For example one of the most widely used dye markers, the green fluorescent protein (GFP), requires an excitation wavelength of 900 nm-980 nm.

As a result, a laser system for biological research applications needs to be designed to optimally balance the above-referenced performance needs. Generally, presently available commercial Ti:sapphire oscillators significantly exceed the performance requirements for most biological research applications, especially the output power levels. Despite the excellent performance of Ti:sapphire oscillators a number of shortcomings have been identified. For example Ti:sapphire oscillators tend to be large, expensive, and complex systems. For example, presently available Ti:sapphire oscillators require a complex multi-stage laser pump system which includes a pump laser and a diode pump source. More specifically, the first stage of the pump system comprises a diode laser system which is used to provide a first pump signal to the pump laser. The second stage of the pump system comprises a pump laser which, in response to the first pump signal, produces a second pump signal. The second pump signal from the pump laser is directed into the Ti:sapphire laser system which produces an output signal. As such, the presently available Ti:sapphire laser systems includes the Ti:sapphire laser device, at least one pump laser source to pump the Ti:sapphire laser, and at least one diode pump source to pump the pump laser system.

In light of the foregoing, there is an ongoing need for a simpler, smaller and lower cost laser system which is capable of delivering the performance characteristics for biological research applications. There is an additional need for a compact and lower cost seed laser for Ti:sapphire amplifier systems that produces pulses of sufficiently short duration.

SUMMARY

The present application discloses various embodiments of a high peak power laser system. More specifically, the high peak power laser system described herein includes a diode pump source configured to directly pump at least one optical crystal positioned within the laser cavity. In one embodiment, the present application discloses a diode pumped high peak power laser system which includes at least one diode pump system configured to output at least one pump beam. The pump beam may be comprised of two or more vertically stacked optical signals having a wavelength from about 400 nm to about 1100 nm. In one embodiment, two optical signals are vertically stacked to produce the pump beam. Optionally, a single optical signal may be used to produce the pump beam. In another embodiment, three optical signals are vertically stacked to produce the pump beam. Any number of optical signals may be stacked to produce the pump beam. Optionally, the optical signals need not be stacked to produce the pump beam. The pump beam is directed into a laser cavity having one or more optical crystals therein. The optical crystals are configured to output at least one optical output having a wavelength of about 750 nm to about 1100 nm and having an output power of about 25 kW or more. While the laser systems disclosed herein is well-suited for use with multi-photon microscopy systems, the laser systems disclosed herein may be used in any variety of applications.

In another embodiment, the present application is directed to a diode pumped high peak power laser system. The diode pumped high peak power laser system includes at least one diode pump system configured to output at least one pump beam. The pump beam comprises two or more vertically stacked optical signals having a wavelength from about 400 nm to about 1100 nm. The pump beams are directed into a laser cavity formed by at least one high reflectivity mirror and at least one output coupler. At least one optical crystal is positioned within the laser cavity. The pump beam from the diode pump source is directed to the optical crystal resulting in the generation of an optical output having a wavelength of about 750 nm to about 1100 nm and having an output power of about 25 kW or more. The output signal may be directed out of the laser cavity via the output coupler and directed into one or more optical systems, including, for example, multi-photon microscope systems.

Other features and advantages of the embodiments of the high peak power laser system as disclosed herein will become apparent from a consideration of the following detailed description.

BRIEF DESCRIPTION OF THE DRAWINGS

Various embodiments of a high peak power laser system will be explained by way of the accompanying drawings, wherein.

DETAILED DESCRIPTION

Figure 1:
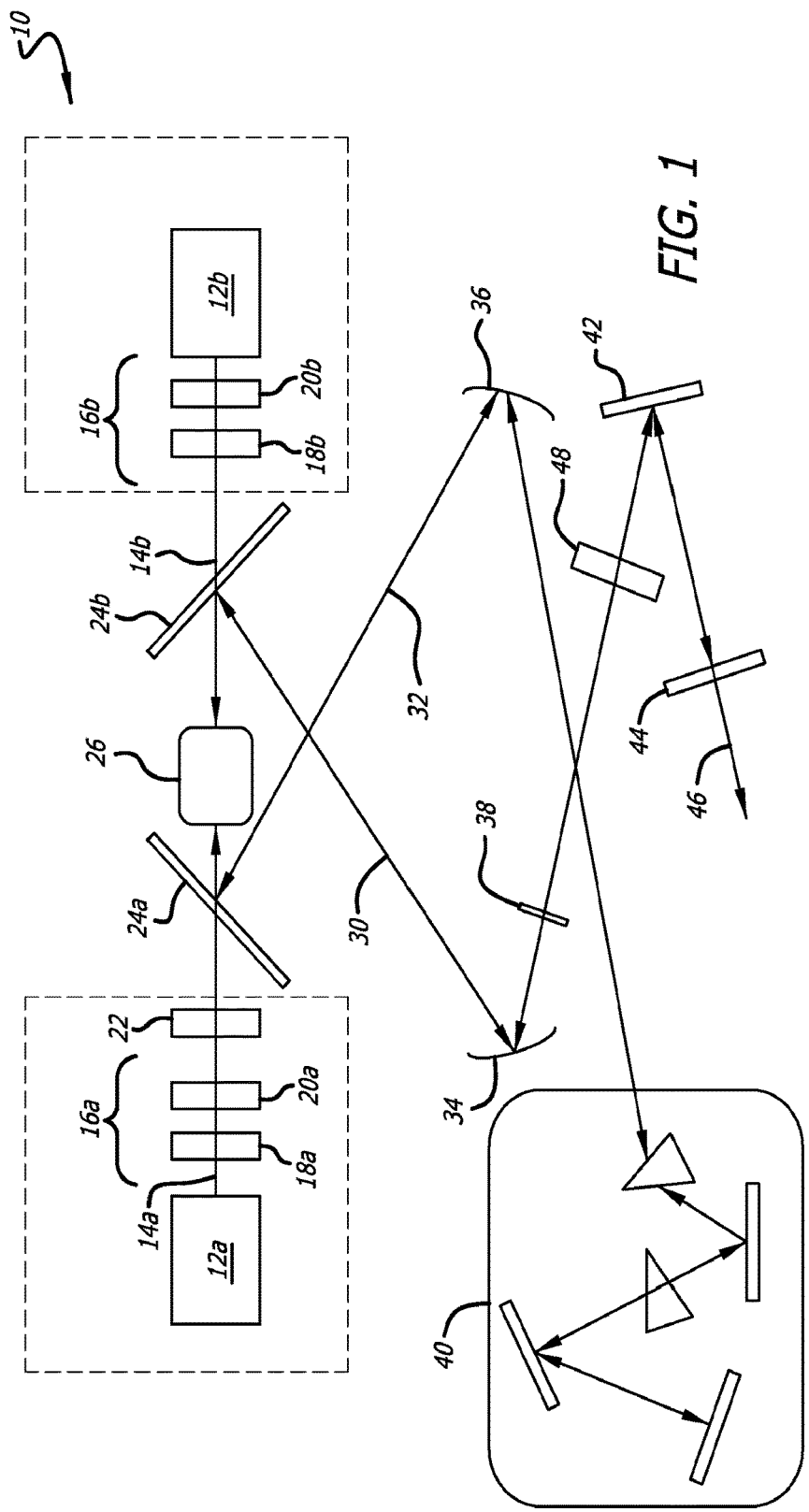
FIG. 1 shows a schematic diagram of an embodiment of a diode pumped high peak power laser system wherein the output of the diode pump system is used to directly pump at least one optical crystal positioned within a laser cavity to produce an optical output having a wavelength of about 750 nm to about 1100 nm and having an output power of about 25 kW or more.

FIG. 1 shows a schematic diagram of a directly diode pumped high peak power laser system for multi-photon applications (hereinafter "diode pumped high peak power laser system"). Unlike prior art Ti:sapphire laser systems, the diode pumped high peak power laser system described herein may be configured to include a diode-based pump system to directly pump the optical crystal positioned within the laser system, thereby eliminating the intermediate pump laser system required in Ti:sapphire-based laser systems. As shown, the diode pumped high peak power laser system 10 includes at least one diode pump source. In the illustrated embodiment, the diode pumped high peak power laser system 10 includes a first diode pump system 12a and a second diode pump system 12b. In an alternate embodiment, the diode pumped high peak power laser system 10 includes a single diode pump system. Optionally, in an alternate embodiment, the diode pumped high peak power laser system 10 includes 3 or more diode pump systems. Further, in another embodiment, the pump system need not comprise a diode pump system. For example, in an alternate embodiment, a fiber pumped high peak power laser system may be constructed which includes at least one fiber-based pump system. In another embodiment, a high peak power laser system may be constructed which includes any variety of pump systems, including, without limitations, diode pump systems, fiber laser pump systems, LED-based pump systems, diode bars, diode stacks, diode laser combining systems, optically-pumped laser systems, Ti:sapphire laser systems and components, and the like.

Referring again to FIG. 1, in the illustrated embodiment the first pump system 12a is configured to output at least a first pump beam 14a. Similarly, the second pump system 12b is configured to output at least a second pump beam 14b. In one embodiment at least one of the first and second pump beams 14a, 14b comprises continuous wave optical signals, although those skilled in the art will appreciate that the pump beams 14a, 14b could be pulsed optical signals. Optionally, in one embodiment at least one of the first and second pump systems 12a, 12b comprises a multi-mode diode source. In another embodiment, at least one of the first and second pump systems 12a, 12b comprises a single mode diode source. In one embodiment, the first and second pump systems 12a, 12b are each configured to output at least one pump beam 14a, 14b having 100 mW or more. In another embodiment, the first and second pump systems 12a, 12b are each configured to output at least one pump beam 14a, 14b having 800 mW or more. In yet another embodiment, the first and second pump systems 12a, 12b are each configured to output at least one pump beam 14a, 14b having 1100 mW or more. Optionally, the pump beams 14a, 14b may exceed one watt. For example, in one embodiment the first pump beam 14a and second pump beam 14b have a power of about 1.5 to about 2.5 watts each, although those skilled in the art will appreciate that the output power of the pump beams 14a, 14b may be greater than 2 watts.

In one embodiment, at least one of the first pump beam 14a and second pump beam 14b has a wavelength of about 400 nm to about 1000 nm. In another embodiment, at least one of the first pump beam 14a and second pump beam 14b has a wavelength of about 500 nm to about 800 nm. In still another embodiment, at least one of the first pump beam 14a and second pump beam 14b has a wavelength of about 600 nm to about 670 nm. Optionally, at least one of the first pump beam 14a and second pump beam 14b has a wavelength of about 625 nm to about 650 nm. For example, the first and second diode pump systems 12a, 12b may be configured to output at least one pump beam 14a, 14b having a wavelength of about 639 nm, although those skilled in the art will appreciate that the present system may be configured to operate with any variety of pump systems at any variety of wavelengths and repetition rates. Further, the first and second diode pump systems 12a, 12b may be configured to output pump beams 14a, 14b having the same or different wavelengths.

As shown in FIG. 1, in one embodiment a first optical system 16a may be positioned within and/or proximate to the first diode pump system 12a. Similarly, in one embodiment a second optical system 16b may be positioned within and/or proximate to the second diode pump system 12b. In the illustrated embodiment, the first and second optical systems 16a, 16b are configured to condition or otherwise modify the pump beams 14a, 14b emitted by the respective first and second diode pump systems 12a, 12b. For example, in one embodiment the first and second optical systems 16a, 16b include at least one cylindrical lens 18a, 18b (hereinafter referred to as "vertical cylindrical lens") configured to condition the pump beams 14a, 14b incident thereon along a vertical axis relative to the diode pump sources 12a, 12b. For example, in the illustrated embodiment, the first diode pump system 12a includes the first cylindrical lens 18a in optical communication therewith and configured to receive the first pump beam 14a there through, while the second diode pump system 12b includes the second cylindrical lens 18b in optical communication therewith and configured to receive the second pump beam 14b there through. In addition, the first and second optical systems 16a, 16b include at least one cylindrical lens 20a, 20b (hereinafter referred to as "horizontal cylindrical lens") configured to condition the pump beams 14a, 14b, respectively, incident thereon along a horizontal axis orthogonal to the vertical axis described above. During use, the vertical cylindrical lenses 18a, 18b and horizontal lenses 20a, 20b condition and focus the pump beams 14a, 14b into at least one optical crystal 26 positioned within the diode pumped high peak power laser system 10. Optionally, as shown in FIG. 1 one or more additional optical elements 22 may be included within at least one of the first and second optical systems 16a, 16b. For example, in the illustrated embodiment, an additional optical element 22 is positioned within the first optical system 16a, although those skilled in the art will appreciate that any number or variety of additional optical elements 22 may be positioned within the first and/or second optical system 16a, 16b. Exemplary additional optical elements include, without limitations, waveplates, lenses, mirrors, filters, polarizers, gratings, modulators, slits, spatial filters, sensors, measurement devices, meters, and the like.

As shown in FIG. 1, in the present embodiment the laser cavity of the diode pumped high peak power laser system 10 is defined by the first dichroic mirror 24a, the second dichroic mirror 24b, a high reflector mirror 128 positioned within the pulse compression systems 40, and the output coupler 44, the laser cavity having at least one optical crystal 26 positioned therein. As such, the laser cavity of the diode pumped high peak power laser system 10 may form a folded laser cavity by including additional mirrors therein. Optionally, the diode pumped high peak power laser system 10 may be formed having any desired laser cavity architecture. In the illustrated embodiment, the diode pumped high peak power laser system 10 includes a first dichroic mirror 24a and a second dichroic mirror 24b configured to transmit the pump beams 14a, 14b therethrough. For example, in one embodiment the first and second dichroic mirrors 24a, 24b are configured to have a transmission window from about 600 nm to about 800 nm. In another embodiment, the first and second dichroic mirrors 24a, 24b are configured to have a transmission window from about 630 nm to about 700 nm. Those skilled in the art will appreciate that the transmission window of the first and second dichroic mirrors is dependent upon the wavelength of the first and second pump beams 14a, 14b. Further, the first and second dichroic mirrors are configured to reflect approximately all the optical signal 30 emitted from the optical crystal 26 within a desired wavelength range. For example, in one embodiment, the first and second dichroic mirrors 24a, 24b are configured to reflect approximately all (e.g. >99.0%) of an optical signal 30 having a wavelength of about 650 nm to about 1100 nm generated by the optical crystal 26.

In another embodiment, the first and second dichroic mirrors 24a, 24b are configured to reflect approximately all (e.g. >99.5%) of an optical signal 30 having a wavelength of about 650 nm to about 1100 nm generated by the optical crystal 26. Optionally, in one embodiment the dichroic mirrors 24a, 24b are configured to reflect greater than 99.99% of the optical signal 30 within a desired wavelength range. In another embodiment, the first and second dichroic mirror are configured to reflect approximately all (e.g. >99.5%) of an optical signal 30 having a wavelength of about 750 nm to about 1050 nm generated by the optical crystal 26. In yet another embodiment, the first and second dichroic mirror are configured to reflect approximately all (e.g. >99.5%) of an optical signal 30 having a wavelength of about 900 nm to about 1000 nm generated by the optical crystal 26. In one embodiment, the first and second dichroic mirrors 24a, 24b comprise planar mirrors. Optionally, at least one of the first and second dichroic mirrors 24a, 24b may comprise curved or concave mirrors.

Referring again to FIG. 1, in the illustrated embodiment a single optical crystal is positioned within the diode pumped high peak power laser system 10. In another embodiment, multiple optical crystals 26 are positioned within the diode pumped high peak power laser system 10. In one embodiment, the optical crystal 26 comprises at least one Cr-doped colquirite crystal (herein after "Cr-colquirite crystal"). Exemplary crystal materials include, without limitations, Cr:LiCaF, Cr:LiSaF, Cr:LiSGaF, Cr:LiSCaGaF, Cr:LiSCaF, Cr:LiCaAlF, Cr:LiSrAlF, Cr3+-doped BeAl2O4, Cr3+: Be3Al2(SiO3)6, Alexandrite crystals, Ti:sapphire crystals and other materials having the gain bandwidth necessary to produce ultrafast pulses. For example, in one embodiment, the optical crystal 26 comprises an approximately 10 mm long Cr:LiSaF crystal. In another embodiment, the optical crystal 26 has a length from about 3 mm to about 50 mm. Many crystals of the colquirite family suffer from thermal quenching. At elevated temperatures the gain, and thus, the power, from the laser can be greatly reduced. At temperatures only ten (10) to twenty (20) degrees Celsius above ambient temperature the output power of the laser incorporating these crystals can be reduced by fifty percent (50%). For some biomedical applications as well as other applications, an air cooled laser is preferred as the need for a water-based chiller system is eliminated. Thus reducing the impact of thermal quenching may provide a laser system configured to use in various applications where the inclusion of a water-based chiller system is inconvenient or impractical. In the alternative, some applications may necessitate the use of a water-cooled chiller. In short, the various embodiments of the laser system described herein may be easily configured to operate using an air-cooled configuration, a water-cooled configuration, or both. Those skilled in the art will appreciate that the laser systems described herein may be configured to be operable with any variety of cooling systems. Typically, short crystals of about 3 mm or 4 mm have been used to minimize the intracavity dispersion and produce shorter pulses. In addition, shorter crystals may provide improved mode-matching with the imperfect mode available from diode pump sources. The applicants of the present application have discovered that by using longer lower doped crystals such as lower doped crystals 10 mm in length, the thermal quenching effect can be substantially avoided without substantially reducing the output peak power due to mode-matching or dispersion. As such, cooling of the lower doped crystals can be accomplished using any variety of cooling systems or devices, such as a thermo-electric (TE) cooler and/or forced air cooling, even when the pump power exceeds a couple of watts. Exemplary pump powers include, without limitations, about 0.25 W to about 10 W or more. In a more specific embodiment, pump power ranges from about 2 W to about 4 W. In another embodiment, pump power ranges from about 1 W to about 2 W.

Further, the optical crystal 26 may have a thickness from about 0.25 mm to about 2.5 mm. In another embodiment, the optical crystal 26 has a thickness of about 0.5 mm to about 1.5 mm. In yet another embodiment, the optical crystal 26 has a thickness of about 0.70 mm to about 0.85 mm. For example, in one specific embodiment, a 10 mm long Cr:LiSaF crystal having a thickness of about 0.8 mm was used to form a diode pumped high peak power laser system 10, although those skilled in the art will appreciate that a crystal of any length and thickness may be used. In one embodiment, at least one surface of the optical crystal 26 is formed at or cut at Brewster's angle relative to the axis of propagation of the incident optical beam or signal. In one embodiment, the axis of propagation through the optical crystal 26 is formed at an angle normal to the optical axis of the optical crystal 26. Optionally, one or more coatings, protective layers, and/or thermal management materials may be applied to the optical crystal 26, such as foils, optical materials, reflective coatings, alignment marking, and the like. In one embodiment, the optical crystal 26 is configured to operate at ambient temperature. In another embodiment, one or more thermal management systems or devices (not shown) may be included within the diode pumped high peak power laser system 10 to increase or decrease the temperature of the optical crystal 26 during use. Exemplary thermal management systems include, without limitations, chillers, TE coolers, heaters, fans, fluid-based thermal management systems, heat pipes, and the like. For example, in one embodiment the optical crystal is maintained at an operating temperature of about 0° C. to about 40° C. In another embodiment, the optical crystal is maintained at an operating temperature of from about 15° C. to about 20° C. To prevent condensation within the laser cavity, the housing for the laser can be kept at a low humidity. This can be accomplished with a purge system or by use of a desiccant cartridge or other known techniques. A reduction of the quantity of water vapor may also be desired to operate the laser at wavelengths where the water absorption can cause losses such as at wavelengths beyond 910 nm.

Referring again to FIG. 1, the pump beams 14a, 14b incident on the optical crystal 26 result in the generation of at least one generated signal 30 within the diode pumped high peak power laser system 10. As shown in the illustrated embodiment, multiple generated signals 30, 32 are emitted by the optical crystal 26 and directed into the laser cavity by the first and second dichroic mirrors 24a, 24b. The generated signals 30, 32 may be incident on one or more mirrors 34, 36 positioned within the laser cavity. For example, in the illustrated embodiment the mirrors 34, 36 comprise concave mirrors having a radius of curvature from about −50 mm to about −450 mm. In another embodiment, the mirrors 34, 36 comprise concave mirrors having a radius of curvature from about −100 mm to about −300 mm. In yet another embodiment, the mirrors 34, 36 comprise concave mirrors having a radius of curvature from about −175 mm to about −230 mm. In a specific embodiment, the mirrors 34, 36 comprise concave mirrors having a radius of curvature from about −200 mm to about −228 mm. Further, in one embodiment at least one of the mirrors 34, 36 may include a negative chirp. For example, in one embodiment the mirrors 34, 36 include a small negative chirp (approximately −10 Fs$^2$) to aid in dispersion compensation. Optionally, mirrors 34, 36 having a larger or smaller chirp may be used. In another embodiment, the mirrors 34, 36 have no chirp. Further, any number, variety, or shape of mirrors may be used in the diode pumped high peak power laser system 10. Control of the total dispersion in the cavity determined by the crystal, prisms and choice of mirrors can be used to optimize the output bandwidth for a given application. Larger bandwidth may lead to higher peak power which may typically lead to better signal to noise in a multi-photon application. This may be true only if the bandwidth of the dye being excited is sufficiently broad and can absorb all the power and if the pulse duration is still short when it reaches the sample. The path from the diode pumped high peak power laser system 10 to the sample may contain mirrors, lenses and microscope objective that will broaden the pulse duration due to dispersion and thus decrease the peak power at the sample. To compensate for this dispersion, any number and/or variety of external dispersion management systems known in the art may be included between the laser and the sample as discussed above. Exemplary external dispersion compensation systems and devices include, without limitations, prisms, chirped mirrors, gratings, Gires-Tournois interferometers, dispersive mirrors, and the like. While semiconductor saturable absorbers have often been used to successfully initiate mode-locking in lasers, Kerr Lens mode-locking (KLM) can provide advantages such as broader tunability and reduced cost and complexity. Kerr Lens mode-locked lasers often require a method to initiate the mode-locking. Optionally, at least one of the mirrors 34, 36 may be positioned on a stage having at least one piezoelectric device (hereinafter "PZT device") coupled thereto or may otherwise include at least one deformable reflective surface thereon. For example, in one embodiment at least one PZT device is in communication with at least one mirror 34, 36 and configured to disrupt laser modes formed within the laser cavity to assist in mode-locking. In another embodiment, at least one solenoid, transducer, cell phone shaker, translation stage, or similar device could be used to disrupt the laser modes within the laser cavity and induce mode locking.

As shown in FIG. 1, at least one filter, knife-edge, or slit 38 may be included in the diode pumped high peak power laser system 10. As shown, a single slit 38 could be positioned distally from the optical crystal 26, although those skilled in the art will appreciate that the slit 38 may be positioned at any location within the laser cavity. Further, in the illustrated embodiment, the generated signal 30 is incident on the slit 38, although those skilled in the art will appreciate that the generated signal 32 may similarly be incident on a slit positioned within the laser cavity. In one embodiment, the slit 38 has a slit size of about 3.0 mm optionally, the present system may easily be adapted to operate with a slit 38 having a slit size of about 5.0 mm to about 0.5 mm. In one embodiment, the slit 38 comprises a vertical slit. Optionally, a horizontal slit may be used with, or in place of, a vertical slit. Further, at least one iris may be configured for use as the slit 38. In another embodiment, the diode pumped high peak power laser system 10 need not include a slit 38 therein.

Figure 9:
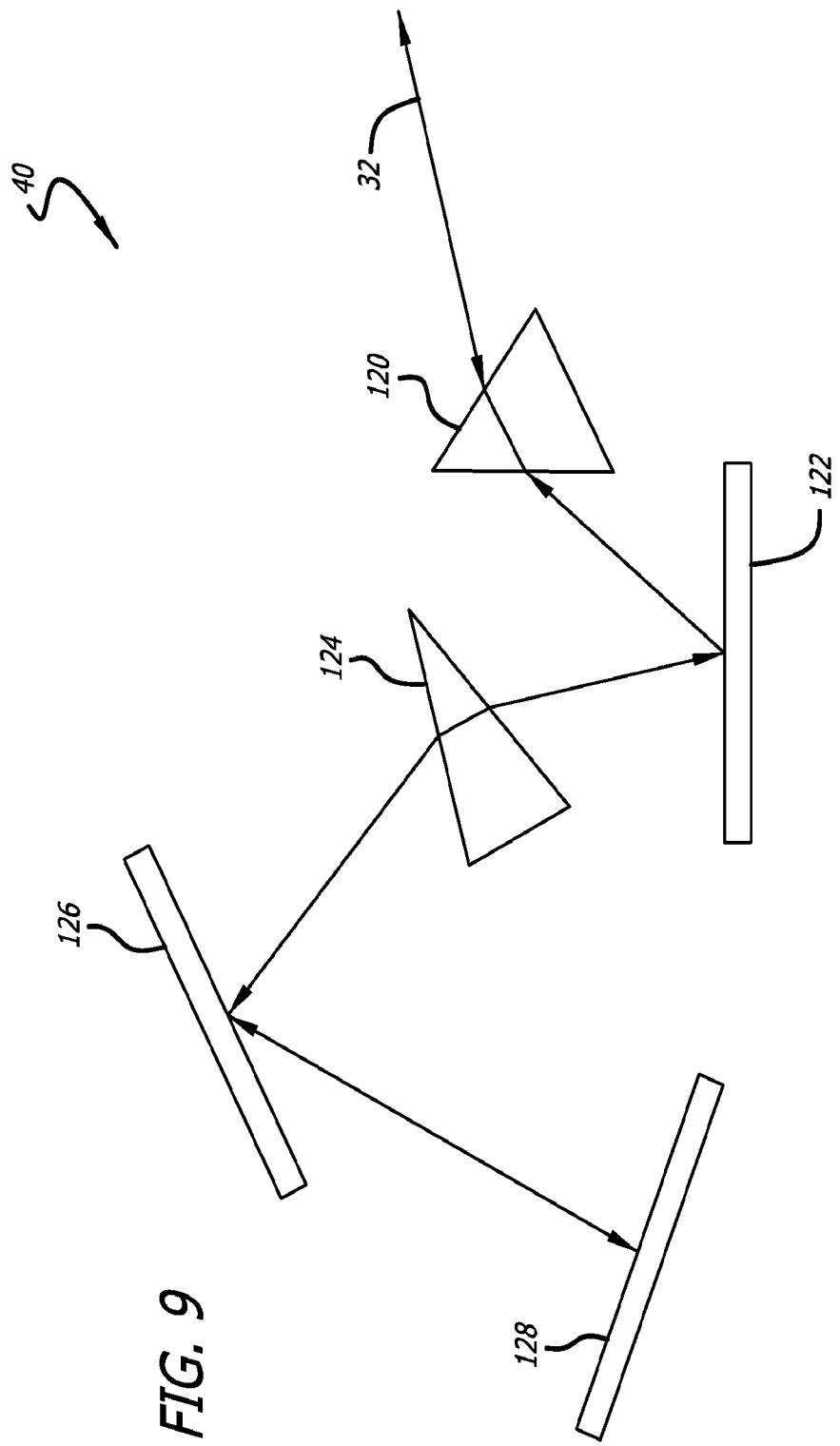
FIG. 9 shows an embodiment of a dispersion compensation system used in the diode pumped high peak power laser system shown in FIG. 1.

As shown in FIGS. 1 and 9, the diode pumped high peak power laser system 10 may include one or more pulse compression systems 40 therein. As shown, the pulse compression system 40 is configured to receive at least one generated signal 30, 32 therein and modify at least one temporal characteristic of the generated signal 30, 32. For example, in one embodiment the pulse compression system 40 comprises a linear pulse compression system as shown in FIGS. 1 and 9. Optionally, the pulse compression system 40 may comprise a non-linear pulse compression system. As shown in FIGS. 1 and 9, at least one generated signal 32 is incident on one or more prisms 120, 124 located within the pulse compression system 40. For example, in one embodiment, at least one of the prisms 120, 124 comprises a fused silica prism, Brewster-cut at about 910 nm, although those skilled in the art will appreciate that the prisms 120,124 may be manufactured from any variety of materials and formed at any variety of angles. Further, one or more mirrors 122, 126, 128 (planar or non-planar) may be included within the pulse compression system 40 to increase the optical path length of the pulse compression system 40 without substantially increasing the physical size of the pulse compression system 40. As a result, the generated signal 32 is incident on each prism 120, 124 when introduced into the pulse compression system 40. Further, the generated signal 32 is reflected back through the prisms 120, 124 by the mirror 128. As a result, the generated signal 32 is incident on each prism 120, 124 twice when traversing trough the pulse compression system 40. Those skilled in the art will appreciate that any number of prisms, mirrors, chirped mirrors, gratings, filters, lenses, and the like may be used in the pulse compression system 40. Optionally, multiple pulse compression systems 40 may be used in the diode pumped high peak power laser system 10.

As shown in FIG. 1, at least one fold mirror 42 may be included within the diode pumped high peak power laser system 10. In the illustrated embodiment, the fold mirror 42 comprises a planar mirror, although those skilled in the art will appreciate that curved mirrors may be used. Further, one or more additional elements 48 may be positioned within the diode pumped high peak power laser system 10. Exemplary additional elements include, without limitations, one or more sensors, PZT devices, filters, lenses, mirrors, chirped mirrors, pulse compression systems, dispersion compensation devices and systems, chirped mirrors, gratings, detectors, and the like may be include at any location within the diode pumped high peak power laser system 10.

Referring again to FIG. 1, the diode pumped high peak power laser system 10 includes at least one output coupler 44 configured to output at least a portion of the generated signal 30, 32. Optionally, the output coupler 44 may comprise a dichroic mirror configured to output an output signal 46 at a desired wavelength. Further, the output coupler 44 may comprise a planar or curved output coupler. Optionally, any variety of output couplers 44 may be used. In the illustrated embodiment, the output coupler 44 is configured to output a portion of the generated signal 30 to form at least one output signal 46 having a wavelength of about 700 nm to about 1100 nm. In another embodiment, the output signal 46 has a wavelength of about 800 nm to about 1000 nm. In yet another embodiment, the output signal 46 has a wavelength of greater than about 900 nm to less than about 1000 nm. Further, the output signal 46 may have a peak power of about 25 kW or more. In another embodiment, the output signal 46 may have a peak power of about 50 kW or more. In yet another embodiment, the output signal 46 may have a peak power of about 75 kW or more. Optionally, the output signal 46 may have a peak power of about 100 kW or more. In addition, the diode pumped high peak power laser system 10 may have a repetition rate of about 10 MHz to about 500 MHz. In another embodiment, the diode pumped high peak power laser system 10 may have a repetition rate of about 25 MHz to about 100 MHz. In yet another embodiment, the diode pumped high peak power laser system 10 may have a repetition rate of about 50 MHz to about 55 MHz. For multi-photon applications, the repetition rate must be sufficiently high to allow scanning of the beam and signal averaging in contradiction to the desire for lower repetition rate which increases the peak power of the laser for a fixed average power as described above. The applicants have determined that a repetition rate between 30 MHz and 70 MHz can satisfy both of these goals, however, any repetition rate may be used with varying degrees of performance.

Figure 2:
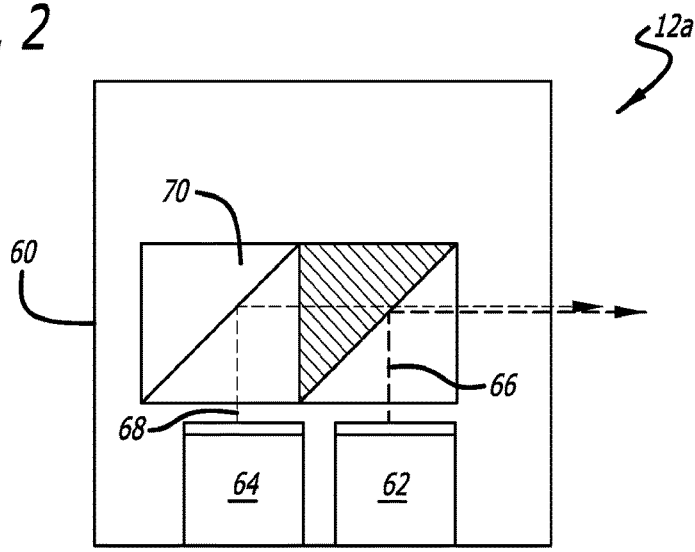
FIG. 2 shows a schematic diagram of an embodiment of a novel diode pump system for use in a diode pumped high peak power laser system wherein the diode pump system includes two diode sources to produce multiple diode signals which are vertically stacked to produce the pump signal.
Figure 3:
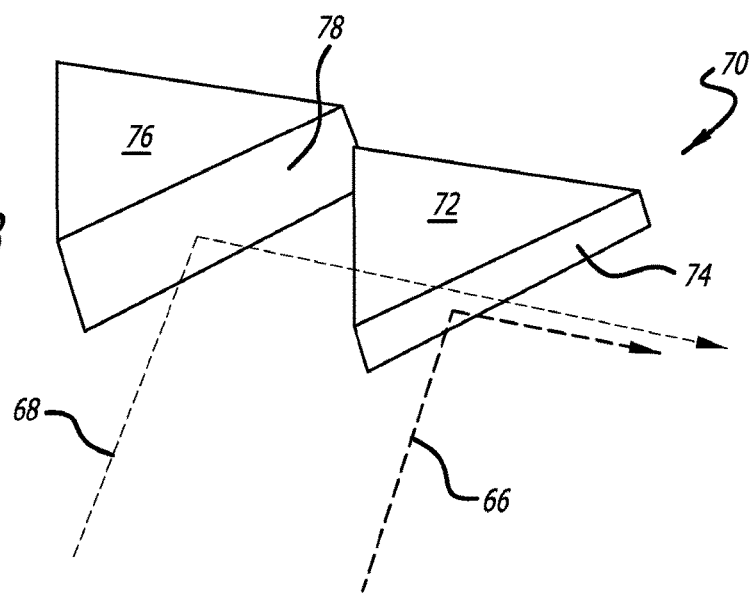
FIG. 3 shows an elevated perspective view of an embodiment of a signal combiner which is used in the novel diode pump system shown in FIG. 2 to vertically stack multiple diode signals to produce a pump signal used to pump an optical crystal within the laser cavity.
Figure 6:
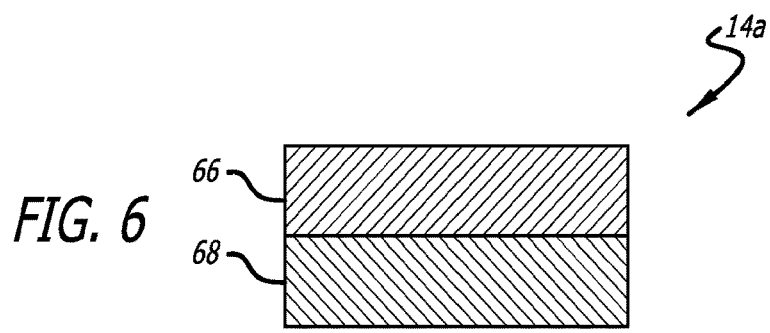
FIG. 6 shows an embodiment of two vertically stacked multiple diode signals used to pump an optical crystal within the laser cavity.
Figure 7:
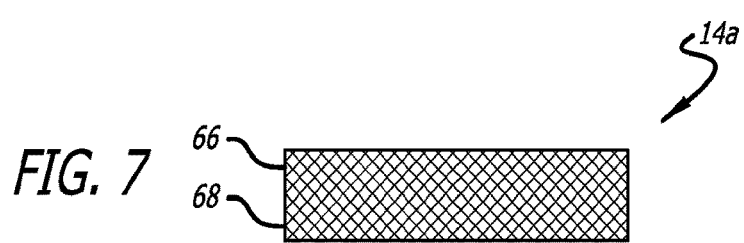
FIG. 7 shows an embodiment of two superimposed diode signals used to pump an optical crystal within the laser cavity.

FIGS. 2 and 3 shows a more detailed view of the novel pump system 12a shown in FIG. 1. As shown, the pump system 12a includes at least one housing 60. A first diode source 62 and at least a second diode source 64 may be positioned within the housing 60. The diode source may comprise individual emitters, arrays of emitters such as the 3 emitter diode chip available from Mitsubishi, or other laser diode sources or devices. At least one of the first diode source 62 and at least a second diode source 64 may be vertically displaced from the other diode source within the housing 60. Optionally, at least one signal combiner 70 may be positioned within the housing 60. The first diode source 62 is configured to emit a first diode signal 66. Similarly, the second diode source 64 is configured to output at least a second diode signal 68. The first diode signal 66 is incident on at least one reflective surface 74 of a first signal combiner body 72 of the signal combiner 70 positioned within the housing 60. Similarly, the second diode signal 68 is incident on at least one reflective surface 78 of a second signal combiner body 76 of the signal combiner 70 positioned within the housing 60. As shown in FIGS. 2, 3, and 6, the first and second signal combiner bodies 72, 76 are positioned such that the first and second diode signals 66, 68 are co-axially aligned along a common vertical axis to form the vertically stacked pump beams 14a, 14b. Typical single stripe diode sources have differing divergences in the two directions. For example in the fast axis direction the $M^2$ can be about 1.5 and in the slow direction the $M^2$ can be about 10. Thus if the fast axis is chosen to be in the vertical direction, stacking two such diode sources vertically leads to a beam with an $M^2$ of 10 by 4 and stacking three such diode sources leads to an $M^2$ of 10 by 8. Such a beam can then be easily focused since the $M^2$ is not too large in either direction. The applicants have found that such a beam quality is sufficient for Kerr Lens Mode-locking. Optionally, as shown in FIG. 7, the first and second diode signals 66, 68 may be co-linearly aligned along a common vertical and horizontal axis, thus producing a super-imposed output. For example, the first and second diode signals 66, 68 may be co-located wherein the first diode signal has a first polarization and the second diode signal has a second polarization. As such, at least one polarizer may be included within the diode pump systems 12a, 12b. Alternatively, the pump diodes may be at different wavelengths and a dichroic mirror may be used to combine the beams. Further, any variety of addition elements may be inserted into at least one of the diode pump sources 12a, 12b, including, without limitations, lenses, gratings, filters, polarizers, power supplies, semiconductor components, and the like. For example, in one embodiment, at least one collimating optical element or other beam shaping device may be positioned proximate to at least one emitter of the first and second diode sources 62, 64 thereby providing a collimated first and second diode signals 66, 68. Alternatively the diodes may be collimated in only one direction such as just the horizontal or vertical directions and not in both directions.

Figure 4:
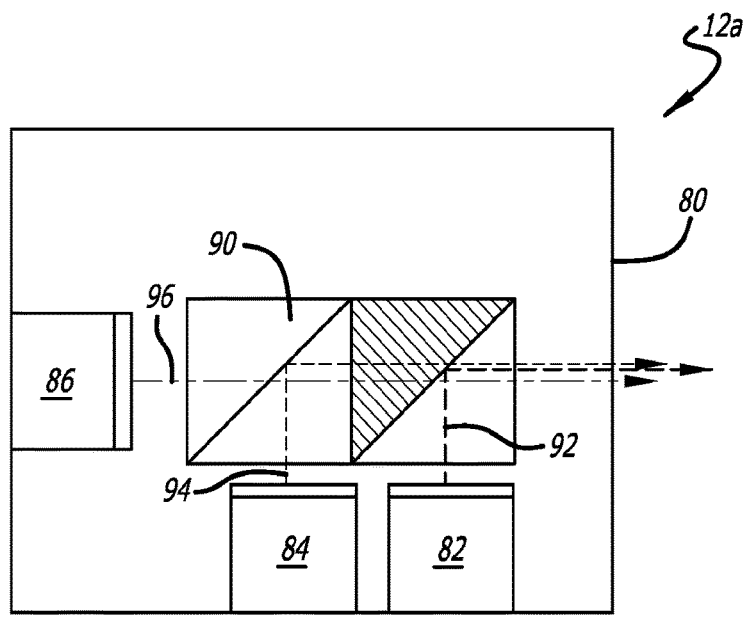
FIG. 4 shows a schematic diagram of an embodiment of a novel diode pump system for use in a diode pumped high peak power laser system wherein the diode pump system includes three diode sources to produce multiple diode signals which are vertically stacked to produce the pump signal.
Figure 5:
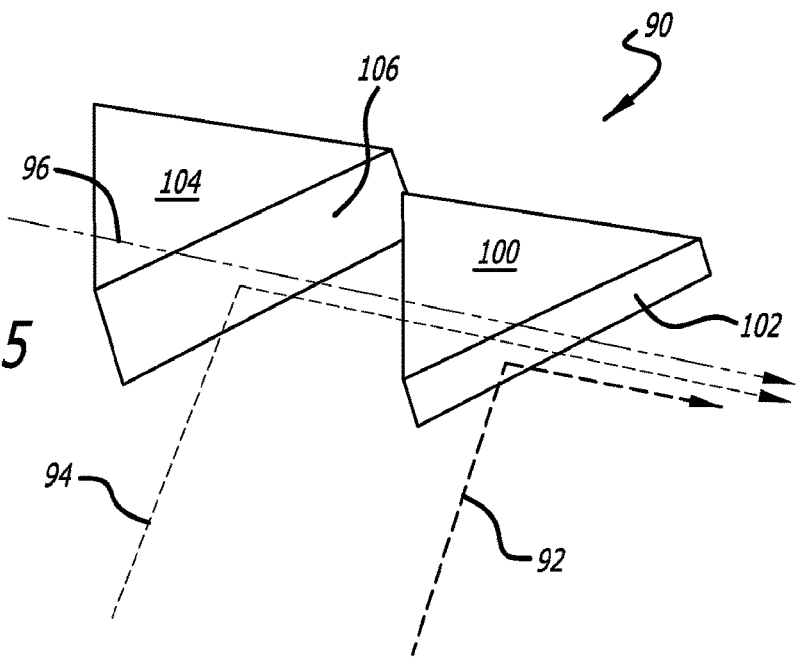
FIG. 5 shows an elevated perspective view of an embodiment of a signal combiner which is used in the novel diode pump system shown in FIG. 4 to vertically stack multiple diode signals to produce a pump signal used to pump an optical crystal within the laser cavity.
Figure 8:
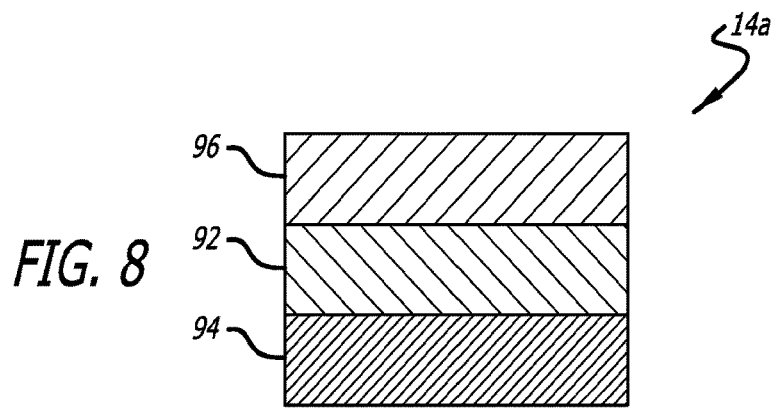
FIG. 8 shows an embodiment of three vertically stacked multiple diode signals used to pump an optical crystal within the laser cavity.

Optionally, the pump systems 12a, 12b, of the diode pumped high peak power laser system 10 may include any number of diode sources therein. As shown in FIGS. 4, 5, and 8 the diode pump source 12a may include at least one housing 80 having a first diode source 82, a second diode source 84, and at least a third diode source 86 located therein. Like the previous embodiment, at least one signal combiner 90 is positioned within the housing 80. At least one of the first diode source 82, second diode source 84, and third diode source 86 is vertically displaced from the other diode sources within the housing 80. The first diode source 82 is configured to emit a first diode signal 92. Similarly, the second diode source 84 is configured to output a second diode signal 94, while the third diode source 86 is configured to output at least a third diode signal 96. The first diode signal 92 is incident on at least one reflective surface 102 of a first signal combiner body 100 of the signal combiner 90 positioned within the housing 60. Similarly, the second diode signal 94 is incident on at least one reflective surface 106 of the second signal combiner body 104 of the signal combiner 90 positioned within the housing 60. In the illustrated embodiment, the third diode signal 96 is configured not to interact with the signal combiner 90. However, those skilled in the art will appreciate that the diode pump source 12a can be easily configured to permit any and/or all diode signals 92, 94, 96 to interact with the signal combiner 90 to provide a stacked pump beam 14a. As shown in FIGS. 4, 5, and 8, the first and second signal combiner bodies 100, 104 are positioned such that the first, second, and third diode signals 92, 94, 96 are co-axially aligned along a common vertical axis to form the vertically stacked pump beams 14a, 14b. Optionally, any variety of addition elements may be inserted into at least one of the diode pump sources 12a, 12b, including, without limitations, lenses, gratings, filters, polarizers, power supplies, semiconductor components, and the like. Optionally, like the previous embodiment, at least one collimating optical element or other beam shaping device may be positioned proximate to at least one emitter of the first, second, and third diode sources 82, 84, 86 thereby providing a collimated first, second, and third diode signals 92, 94, 96.

In one embodiment, four pump diodes operating at 639 nm were used to pump a Cr:LiSAF crystal. Two diodes were vertically stacked as shown in FIG. 6 and each of two such stacked beams were incident on the crystal as shown in FIG. 1 for a total of pump power of 3 W. The laser was configured to operate at a repetition rate of 50 MHz and produced 660 mW of average power at 920 nm with a pulse duration of 70 fs. This corresponds to a pulse energy of more than 13 nJ and a peak power of more than 180 kW.

The embodiments disclosed herein are illustrative of the principles of the invention. Other modifications may be employed which are within the scope of the invention. Accordingly, the devices disclosed in the present application are not limited to that precisely as shown and described herein.

What is claimed is:

1. A diode pumped high peak power laser system, comprising:
   at least one diode pump system configured to output at least one pump beam, the pump beam comprising two or more vertically stacked continuous wave pump signals having a wavelength from about 400 nm to about 1100 nm, wherein the diode pump system comprises a first diode source configured to output a first continuous wave diode signal and at least one second diode source configured to output a second continuous wave diode signal, the diode pump system further comprising at least one vertical cylindrical lens and at least one horizontal cylindrical lens in optical communication with the first diode source and the second diode source;
   at least one signal combiner positioned within the diode pump system, the signal combiner configured to receive and vertically position the first continuous wave diode signal and second continuous wave diode signal along a common vertical axis to produce at least one vertically stacked pump beam;
   at least one laser cavity formed by at least one high reflectivity mirror and at least one output coupler;
   at least one optical crystal positioned within the laser cavity and configured to be pumped by the pump beam, the optical crystal configured to output at least one output signal via at least one output coupler, the output signal having a wavelength of about 750 nm to about 1100nm, a repetition rate between about 30 MHz and about 100 MHz, and having an output power of about 25 kW or more; and
   at least one pulse compression system in optical communication with the at least one optical crystal.

2. The diode pumped high peak power laser system of claim 1 further comprising at least one signal combiner positioned within the diode pump system, the signal combiner configured to receive and vertically and horizontally position the first continuous wave diode signal and second continuous wave diode signal a common vertical and horizontal axis to produce at least one stacked pump bean.

3. The diode pumped high peak power laser system of claim 1 wherein the diode pump system includes a first diode source configured to output a first continuous wave diode signal, a second diode source configured to output a second continuous wave diode signal, and at least a third diode source configured to output at least a third continuous wave diode signal.

4. The diode pumped high peak power laser system of claim 3 further comprising at least on signal combiner positioned within the diode pump system, the signal combiner configured to receive and vertically and horizontally position the first continuous wave diode signal, second continuous wave diode signal, and at least the third continuous wave diode signal along a common vertical and horizontal axis to produce at least one stacked pump beam.

5. The diode pumped high peak power laser system of claim 1 wherein the optical crystal is selected from the group consisting of Cr-doped crystals, Cr:LiCaF crystals, Cr:LiSaF crystals, Cr:LiSGaF crystals, Cr:LiSCaGaF crystals, Cr:LiSCaF crystals, Cr:LiCaAlF crystals, Cr:LiSrAlF crystals, $Cr^{+3}:BeAl_2O_4$ crystals, $Cr^{+3}:Be_3Al_2(SiO_3)_6$ crystals, Alexandrite crystals, and Ti:sapphire crystals.

6. The diode pumped high peak power laser system of claim 1 further comprising the output signal having a wavelength between about 910 nm and 1000 nm.

7. The diode pumped high peak power laser system of claim 1 further comprising the output signal having a peak power greater than 50 kW at a wavelength between 900 nm and 1000 nm.

8. The diode pumped high peak power laser system of claim 1 further comprising the output signal having a peak power greater than about 100 kW at a wavelength from about 900 nm to about 1000 nm.

9. A diode pumped high peak power laser system, comprising:
   at least one diode pump system comprising at least one vertical cylindrical lens and at least one horizontal cylindrical lens and configured to output at least one pump beam, the pump beam comprising two or more vertically stacked continuous wave diode signals having a wavelength from about 400 nm to about 1100 nm and having a repetition rate between about 30 MHz and 100 MHz, wherein the diode pump system comprises a first diode pump system configured to output a first diode source signal and at least a second diode pump system configured to output at least a second diode pump signal;

at least one laser cavity formed by at least one high reflectivity mirror and at least one output coupler;

at least one optical crystal positioned within the laser cavity, the optical crystal configured to be pumped by the pump beam from the diode pump system and output at least one output signal via at least one output coupler, the output signal having a wavelength of about 750 nm to about 1100 nm, having a repetition rate between about 30 MHz and 100 MHz and having an output power of about 25 kW or more, wherein the optical crystal is selected from the group consisting of Cr-doped crystals, Cr:LiCaF crystals, Cr:LiSaF crystals, Cr:LiSGaF crystals, Cr:LiSCaGaF crystals, Cr:LiSCaF crystals, Cr:LiCaAlF crystals, Cr:LiSrAlF crystals, $Cr^{+3}$: $BeAl_2O_4$ crystals, $Cr_{+3}$:$Be_3Al_2(SiO_3)_6$ crystals, Alexandrite crystals, and Ti:sapphire crystals; and at least one pulse compression system in optical communication with the at least one optical crystal.

10. The diode pumped high peak power laser system of claim 9 further comprising the output signal having a repetition rate between about 30 MHz and 70 MHz.

11. The diode pumped high peak power laser system of claim 9 further comprising the output signal having a wavelength between about 925 nm and 1000 nm.

12. The diode pumped high peak power laser system of claim 9 further comprising the output signal having a peak power greater than 50 kW at a wavelength between 900 nm and 1000 nm.

13. The diode pumped high peak power laser system of claim 9 further comprising the output signal having a peak power greater than about 100 kW at a wavelength from about 900 nm to about 1000nm.

\* \* \* \* \*